(12) United States Patent
Geissler et al.

(10) Patent No.: US 9,158,310 B2
(45) Date of Patent: *Oct. 13, 2015

(54) INTEGRATING A DATA CENTER THERMAL CONTROL SYSTEM AND INDIVIDUAL FAN CONTROLLERS FOR CONTROLLING A THERMAL ENVIRONMENT IN A DATA CENTER ROOM

(75) Inventors: Andrew Geissler, Pflugerville, TX (US); Michael C. Hollinger, Round Rock, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 514 days.

This patent is subject to a terminal disclaimer.

(21) Appl. No.: 13/325,572

(22) Filed: Dec. 14, 2011

(65) Prior Publication Data

US 2013/0158713 A1 Jun. 20, 2013

(51) Int. Cl.
*G05D 23/00* (2006.01)
*B60H 1/00* (2006.01)
*G05D 23/19* (2006.01)
*H05K 7/20* (2006.01)

(52) U.S. Cl.
CPC ............ *G05D 23/19* (2013.01); *G05D 23/1932* (2013.01); *H05K 7/20745* (2013.01); *H05K 7/20836* (2013.01)

(58) Field of Classification Search
CPC ............................ G05D 23/1932; G05D 23/19
USPC ........................................................ 700/275
See application file for complete search history.

(56) References Cited

U.S. PATENT DOCUMENTS

| 4,530,395 | A | * | 7/1985 | Parker et al. ................... 165/208 |
| 4,823,290 | A | | 4/1989 | Fasack et al. |
| 4,874,127 | A | | 10/1989 | Collier |
| 5,544,697 | A | * | 8/1996 | Clark ............................ 165/209 |

(Continued)

FOREIGN PATENT DOCUMENTS

| JP | 02308634 A | 8/1989 |
| JP | 201174028 A | 6/2001 |

OTHER PUBLICATIONS

U.S. Appl. No. 13/345,995, filed Jan. 9, 2012, Andrew Geissler et al, International Business Machines Corporation, 61 pages.

(Continued)

*Primary Examiner* — Mohammad Ali
*Assistant Examiner* — Yuhui R Pan
(74) *Attorney, Agent, or Firm* — Parashos T. Kalaitzis; Amy J. Pattillo

(57) ABSTRACT

A thermal control system for a data center room, for controlling an ambient temperature in the data center room to meet an ambient temperature set point, receives multiple ambient temperature votes from multiple fan controllers positioned in the data center room each for controlling fan speeds for at least one separate fan from among multiple fans each positioned within a separate system from among multiple systems within the data center room. The thermal control system sets the ambient temperature set point to a lowest ambient temperature specified in the multiple ambient temperature votes, such that the thermal control system and fan controllers operate as independent systems, but are integrated for selecting an ambient temperature that minimizes the power required for controlling a thermal environment in the data center room.

5 Claims, 6 Drawing Sheets

(56) References Cited

U.S. PATENT DOCUMENTS

| | | | |
|---|---|---|---|
| 5,801,940 A * | 9/1998 | Russ et al. | 700/9 |
| 6,624,394 B2 | 9/2003 | Chasen et al. | |
| 6,826,456 B1 * | 11/2004 | Irving et al. | 700/299 |
| 6,868,682 B2 | 3/2005 | Sharma et al. | |
| 7,377,450 B2 | 5/2008 | Van Ostrand et al. | |
| 7,721,128 B2 | 5/2010 | Johns et al. | |
| 2003/0110423 A1 | 6/2003 | Helms et al. | |
| 2004/0141542 A1 * | 7/2004 | Sharma et al. | 374/141 |
| 2005/0228618 A1 | 10/2005 | Patel et al. | |
| 2005/0277381 A1 | 12/2005 | Banerjee | |
| 2006/0047808 A1 | 3/2006 | Sharma et al. | |
| 2006/0168975 A1 * | 8/2006 | Malone et al. | 62/180 |
| 2007/0227710 A1 | 10/2007 | Belady et al. | |
| 2008/0104985 A1 | 5/2008 | Carlsen | |
| 2008/0125915 A1 * | 5/2008 | Berenbaum et al. | 700/278 |
| 2008/0141048 A1 | 6/2008 | Palmer et al. | |
| 2010/0076607 A1 * | 3/2010 | Ahmed et al. | 700/276 |
| 2010/0102136 A1 * | 4/2010 | Hadzidedic et al. | |
| 2010/0252233 A1 | 10/2010 | Absalom | |
| 2010/0296915 A1 | 11/2010 | Suzuki et al. | |
| 2011/0100618 A1 * | 5/2011 | Carlson | 165/287 |
| 2012/0016526 A1 * | 1/2012 | Burton | 700/278 |
| 2012/0158190 A1 | 6/2012 | Belady et al. | |
| 2013/0178999 A1 | 7/2013 | Geissler et al. | |
| 2014/0046489 A1 | 2/2014 | Geissler et al. | |
| 2014/0052311 A1 | 2/2014 | Geissler et al. | |

OTHER PUBLICATIONS

Data Aire, Unity Cooling, accessed online as of Dec. 1, 2011 from http://www.dataaire.com/downloads/UnityCooling.pdf, 2 pages.

McCreary, H.-Y., et al., "EnergyScale for IBM POWER6 microprocessor-based systems", IBM J. Res. & Dev., vol. 51, No. 6, Nov. 2007, pp. 775-786, 12 pages.

Broyles, Martha et al., "IBM EnergyScalefor POWER7 Processor-Based Systems", Apr. 2011, available online at ftp://public.dhe.ibm.com/common/ssi/ecm/en/pow03039usen/POW03039USEN.PDF, pp. 1-66, 66 pages.

U.S. Appl. No. 14/058,551, filed Oct. 21, 2013, In re Geissler, International Business Machines Corporation, 37 pages.

Non-final Office Action, mailing date May 22, 2014, U.S. Appl. No. 13/345,995, filed Jan. 9, 2012, In re Geissler, 42 pages.

Non-final Office Action, mailing date Nov. 20, 2014, U.S. Appl. No. 14/058,551, filed Oct. 21, 2013, In re Geissler, 71 pages.

Final Office Action, mailing date Oct. 3, 2014, U.S. Appl. No. 13/345,995, filed Jan. 9, 2012, In re Geissler, 50 pages.

Notice of Allowance, mailing date Mar. 11, 2015, U.S. Appl. No. 14/058,551, filed Oct. 21, 2013, In re Geissler, 21 pages, available via PAIR/IFW.

Notice of Allowance, mailing date Apr. 13, 2015, U.S. Appl. No. 13/345,995, filed Jan. 9, 2012, In re Geissler, 36 pages, available via PAIR/IFW.

In Re Gupta, "Thermal Management of Data Centers through Thermal-Aware Job Scheduling", Mobile Computing Research Group, iMPACT, accessed via the Internet at <https://impact.asu.edu/—mcn/DataCenter.htm> as of May 9, 2015, 4 pages.

Notice of Allowance, mailing date Jun. 9, 2015, U.S. Appl. No. 14/058,551, filed Oct. 21, 2013, In re Geissler, 19 pages, available via PAIR/IFW.

Notice of Allowance, mailing date Jun. 30, 2015, U.S. Appl. No. 13/345,995, filed Jan. 9, 2012, In re Geissler, 36 pages, available via PAIR/IFW.

* cited by examiner

INTEGRATING A DATA CENTER THERMAL CONTROL SYSTEM AND INDIVIDUAL FAN CONTROLLERS FOR CONTROLLING A THERMAL ENVIRONMENT IN A DATA CENTER ROOM

BACKGROUND

1. Technical Field

This invention relates in general to control systems for cooling data center rooms and more particularly to integrating a data center thermal control system and individual fan controllers within systems within the data center room to minimize the power required for controlling the thermal environment in the data center room.

2. Description of the Related Art

A data center is generally housed in a data center room, or other space, that houses numerous electronic systems. In one example, the electronic systems are arranged in racks and multiple racks are arranged into a row. In another example, the electronic systems are housed in server stacks.

Electronic systems can be configured to house different combinations of components including servers, networking equipment, and storage devices. The components may be embedded in a number of printed circuit (PC) boards, where the PC boards may include a number of subcomponents, such as processors, micro-controllers, video cards, memories and other devices that each dissipate heat during operation.

In a data center room, power is required to run the electronic systems, however, power is also required to remove heat dissipated by the components of the electronic systems. As the number of components in an electronic system and number of electronic systems in a data center room increases, more power is required to remove the heat dissipated by the electronic systems during operation and control the thermal environment in the data center room.

In many data centers a thermal control system, such as a Computer Room Air Conditioning (CRAC) unit, is installed to monitor and maintain the air temperature in the entire room. Separately, each system in the data center room may include one or more fans, each controlled by a separate fan controller that controls fan speeds within electronic systems, to control airflow within each system enclosure.

BRIEF SUMMARY

In view of the foregoing, there is a need for a method, system, and program product for integrating the independent data center thermal control system for a data center room that controls an ambient temperature in the data center room, such as a CRAC, with the independent fan controllers in a data center room that control local air flow within systems, to minimize the power required for controlling the overall thermal environment in the data center room.

In another embodiment, a system for managing a thermal environment includes a data center room comprising a plurality of computer systems each housing at least one fan from among a plurality of fans each positioned in the plurality of computer systems for controlling a separate local temperature by controlling local airflow within each separate computer system from among the plurality of systems, wherein each fan is controlled by at least one fan controller from among a plurality of fan controllers positioned within the plurality of computer systems, wherein each of the plurality of computer systems comprises a separate at least one component that generates heat. The system includes each separate fan controller comprising a closed-loop fan controller system with a single input and a single output for controlling at least one fan of the plurality of fans, each fan controller system specified with a separate thermal set point comprising a maximum temperature for at least one of a plurality of components of each of the plurality of systems. The system includes each separate fan controller from among the plurality of fan controllers operative to receive the single input comprising at least one separate component temperature of at least one temperature measured by a component sensor proximate to the separate at least one component and an local ambient temperature measured by a temperature sensor proximate to air surrounding the at least one separate component and not proximate to exhaust air pushed out by the at least one fan. The system includes each separate fan controller operative to apply at least one local optimization rule to calculate, based on the single input and the thermal set point, a desired ambient temperature and a fan speed relationship to correct differences between the single input and the thermal set point and optimize power usage for cooling of the separate at least one component by the separate fan controller in relation to a separate cooling of an ambient temperature in the data center room by one or more cooling units, wherein the fan speed relationship specifies the single output comprising a control signal for specifying whether to turn the at least one fan of the plurality of fans on and a speed for the at least one fan if turned on. The system includes each separate fan controller operative to output a control signal for the calculated fan speed to control a separate fan from among the plurality of fans. The system includes each separate fan controller operative to output the desired ambient temperature in a separate ambient temperature vote from among the plurality of ambient temperature votes. The system includes a thermal control system for controlling the ambient temperature in the data center room to meet an ambient temperature set point through a cooling unit controller that directs the one or more cooling units that control cooling of the ambient temperature within the data center room to meet the ambient temperature set point, wherein the cooling unit controller only directs the one or more cooling units, wherein the cooling unit controller and the one or more cooling units operate independently of the plurality of fan controllers and the plurality of fans, wherein the thermal control system does not direct the plurality of fan controllers. The system includes the thermal control system operative to receive each separate ambient temperature from among the plurality of ambient temperature votes from the plurality of fan controllers, each separate ambient temperature vote comprising an identifier for a particular system from among the plurality of systems, a desired ambient temperature, and at least one maximum temperature from among a maximum ambient temperature and a maximum component temperature. The system includes the thermal control system, operative to set the ambient temperature set point to a lowest ambient temperature specified in the plurality of ambient temperature votes, by calculating the lowest ambient temperature specified in the plurality of ambient temperature votes by removing at least one outlier temperature from among the plurality of ambient temperature votes and calculating a median temperature of the remaining ambient temperature votes from among the plurality of ambient temperature votes, wherein the lowest ambient temperature is set to the median temperature. The system includes the thermal control system, operative to output the ambient temperature set point for each thermal area to the cooling unit controller. The system includes the thermal control system operative to collect the plurality of ambient temperature votes during a first collection period, wherein the plurality of fan controllers report the plurality of ambient temperature votes during the first collection period. The system includes the thermal control system operative to store a fan vote record of the plurality of ambient temperature votes. The system includes the thermal control system operative to collect a second plurality of ambient temperature votes during a second collection period, wherein the second plurality of ambient temperature votes is less than the plurality of ambient temperature votes. The system includes the thermal control system, responsive to reaching the end of the second collection period, operative to determine at least one particular fan controller from among the plurality of fan controllers previously reporting during the first collection period are not reporting during the second collection period. The system includes the thermal control system, responsive to detecting the at least one particular fan controller not reporting during the second collection period, operative to mark a status of the at least one particular fan controller as not reporting in the fan vote record to indicate the at least one particular system is not reporting during the second collection period and identify at least one desired ambient temperature vote for the at least one particular system from at least one previously recorded desired ambient temperature vote stored in the fan vote record in association with the at least one particular fan controller. The system includes the thermal control system, responsive to detecting all of the plurality of fan controllers not reporting during the second reporting period, for maintaining the ambient temperature set point at a temperature that does not exceed any hottest component temperature setting any of the plurality of components of the plurality of systems.

In another embodiment, a computer program product for managing a thermal environment in a data center room is tangibly embodied in a computer-readable storage medium and includes computer executable instructions which cause a computer to receive, by a thermal control system for a data center room comprising a plurality of computer systems for controlling an ambient temperature in the data center room to meet an ambient temperature set point, a plurality of ambient temperature votes from a plurality of fan controllers positioned in the data center room, the plurality of computer systems each housing at least one fan from among plurality of fans each positioned in the plurality of computer systems for controlling a separate local temperature by controlling local airflow within each separate computer system from among the plurality of computer systems, wherein each of the plurality of computer systems comprises a separate at leas tone component that generates heat, each separate fan controller comprising a closed-loop fan controller system with a single input and a single output for controlling at least one fan of the plurality of fans, each fan controller system specified with a separate thermal set point comprising a maximum temperature for at least one of a plurality of components of each of the plurality of systems, each separate fan controller from among the plurality of fan controllers operative to receive the single input comprising at least one separate component temperature of at least one temperature measured by a component sensor proximate to the separate at least one component and an local ambient temperature measured by a temperature sensor proximate to air surrounding the at least one separate component and not proximate to exhaust air pushed out by the at least one fan, each separate fan controller operative to apply at least one local optimization rule to calculate, based on the single input and the thermal set point, a desired ambient temperature and a fan speed relationship to correct differences between the single input and the thermal set point and optimize power usage for cooling of the separate at least one component by the separate fan controller in relation to a separate cooling of the ambient temperature in the data center room by one or more cooling units, wherein the fan speed relationship specifies the single output comprising a control signal for specifying whether to turn the at least one fan of the plurality of fans on and a speed for the at least one fan if turned on, each separate fan controller operative to output a control signal for the calculated fan speed to control a separate fan from among the plurality of fans, each separate fan controller operative to output the desired ambient temperature in the separate ambient temperature vote from among the plurality of ambient temperature votes, each separate ambient temperature vote comprising an identifier for a particular system from among the plurality of systems, a desired ambient temperature, and at least one maximum temperature from among a maximum ambient temperature and a maximum component temperature. The computer program product includes computer executable instructions which cause a computer to set the ambient temperature set point for a data center room to a lowest ambient temperature specified in the multiple ambient temperature votes, by calculating the lowest ambient temperature specified in the plurality of ambient temperature votes by removing at least one outlier temperature from among the plurality of ambient temperature votes and calculating a median temperature of the remaining ambient temperature votes from among the plurality of ambient temperature votes, wherein the lowest ambient temperature is set to the median temperature. The computer program product includes computer executable instructions which cause a computer to output, by the thermal control system, the ambient temperature set point for each thermal area to a cooling unit controller, the cooling unit controller for controlling the ambient temperature in the data center room to meet the ambient temperature set point by directing the one or more cooling units that control cooling of the ambient temperature within the data center room to meet the ambient temperature set point, wherein the cooling unit controller only directs the one or more cooling units, wherein the cooling unit controller and one or more cooling units operate independently of the plurality of fan controllers and the plurality of fans, wherein the thermal control system does not direct the plurality of fan controllers. The computer program product includes computer executable instructions which cause a computer to collect, by the thermal control system, the plurality of ambient temperature votes during a first collection period, wherein the plurality of fan controllers report the plurality of ambient temperature votes during the first collection period. The computer program product includes computer executable instructions which cause a computer to store, by the thermal control system, a fan vote record of the plurality of ambient temperature votes. The computer program product includes computer executable instructions which cause a computer to collect, by the thermal control system, a second plurality of ambient temperature votes during a second collection period, wherein the second plurality of ambient temperature votes is less than the plurality of ambient temperature votes. The computer program product includes computer executable instructions which cause a computer to, responsive to reaching the end of the second collection period, determine, by the thermal control system, at least one particular fan controller from among the plurality of fan controllers previously reporting during the first collection period are not reporting during the second collection period. The computer program product includes computer executable instructions which cause a computer to, responsive to detecting the at least one particular fan controller not reporting during the second collection period, mark, by the thermal control system, a status of the at least one particular fan controller as not reporting in the fan vote record to indicate the at least one particular system is not reporting during the second collection period and identify at least one desired ambient temperature vote for the at least one particular system from at least one previously recorded desired ambient temperature vote stored in the fan vote record in association with the at least one particular fan controller. The computer program product includes computer executable instructions which cause a computer to, responsive to detecting all of the plurality of fan controllers not reporting during the second reporting period, maintain, by the thermal control system, the ambient temperature set point at a temperature that does not exceed any hottest component temperature setting any of the plurality of components of the plurality of systems.

BRIEF DESCRIPTION OF THE SEVERAL VIEWS OF THE DRAWINGS

The novel features believed characteristic of one or more embodiments of the invention are set forth in the appended claims. The one or more embodiments of the invention itself however, will best be understood by reference to the following detailed description of an illustrative embodiment when read in conjunction with the accompanying drawings, wherein:

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

In addition, in the following description, for purposes of explanation, numerous systems are described. It is important to note, and it will be apparent to one skilled in the art, that the present invention may execute in a variety of systems, including a variety of computer systems and electronic devices operating any number of different types of operating systems.

Figure 1:
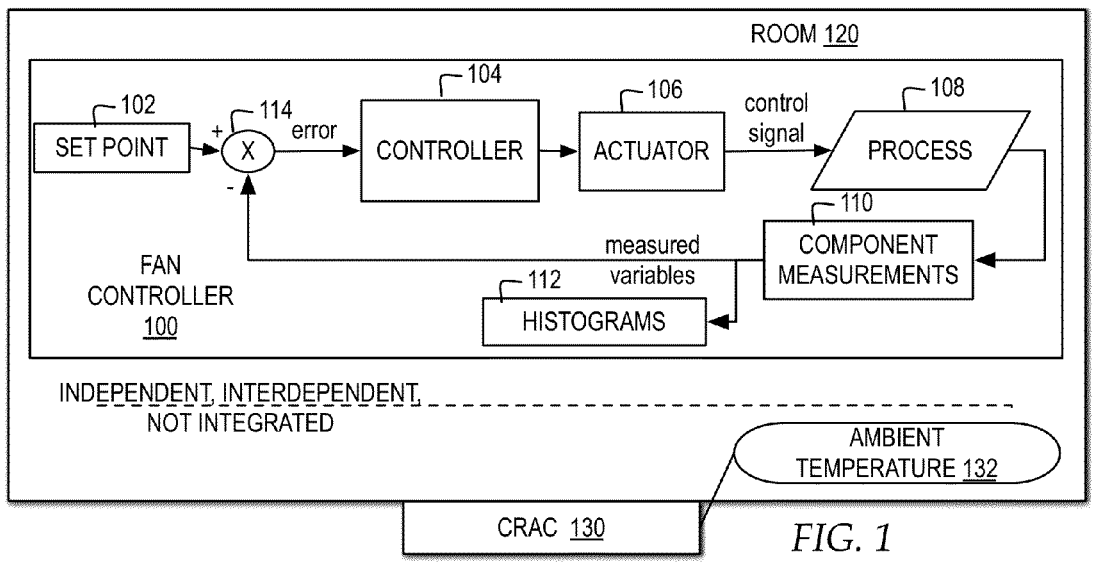
FIG. 1 is a block diagram illustrating one example of a thermal control system for monitoring and maintaining the temperature in a data center room and a fan controller for controlling a fan speed of a fan within a system within the data center room, where the thermal control system and the fan controller are independent systems that are not integrated, but both are part of the cooling infrastructure that uses power to control a thermal environment within a data center room.

With reference now to the figures, and in particular with reference now to FIG. 1, a block diagram illustrates one example of a thermal control system for monitoring and maintaining an ambient temperature in a data center room and a fan controller for controlling a fan speed of a fan within a system within the data center room, where the thermal control system and the fan controller are independent systems that are not integrated, but both are part of the cooling infrastructure that uses power to control a thermal environment within a data center room.

In the example, a room 120 of a data center represents a physical space that includes one or more systems or components that produce heat and one or more fan controllers, such as fan controller 100, for controlling the fan speeds of one or more fans proximate to the one or more systems for controlling the local air flow through one or more systems. In addition, a thermal control system 130 monitors an ambient temperature 132 in room 120 and manages adjustments to ambient temperature 132 through one or more cooling units that control ambient temperature, room wide air flow, and humidity within room 120. Fan controller 100, locally within a system, and thermal control system 130, within the room as a whole, together provide cooling infrastructure that impacts a thermal environment within room 120.

In one example, fan controller 100 implements a closed-loop fan control system with a single-input and single-output for controlling fan speeds of one or more fans to maintain air temperatures proximate to one or more components that dissipate heat within a system within room 120. In the example illustrated, a fan controller 100 includes thermal set point 102 specified with a maximum temperature for one or more critical components within a system. For example, set point 102 may be specified for a CPU core at "105 C", where the CPU core must not exceed 105 C. Component measurements 110 include component or system temperatures sensed by one or more sensors for a component or system, such as temperature sensed for the CPU core by a thermometer positioned to sense the temperature proximate to the CPU core inside a system or a temperature of exhaust air from a fan cooling a particular component. A comparator 114 compares set point 102 with measurements 110 and calculates the difference between set point 102 and measurements 110, or error, to controller 104. Controller 104 applies a control algorithm to determine the appropriate fan speed to reduce any error and keep the measured component below the threshold specified by set point 102. In one example, controller 102 sets an RPM based on the desired cubic feet per minute of air flow through a system required to keep the measured component below the threshold. An actuator 106 generates a control signal to turn on or turn off the fan and to set the RPM for the fan. Process 108 represents the process performed by the control signal on the fan. The current temperature of each component as a result of process 108 is measured in component measurements 110, and fed back in to compactor 114 for comparison against set point 102. The measured temperatures from component measurements 110 are also collected in histograms 112 for monitoring temperature patterns over time.

In one example, thermal control system 130 monitors ambient temperature 132 from one or more thermometers within one or more areas of room 120. In one example, ambient temperature 132 represents the temperature of the air within room 120. As described herein, an ambient temperature, such as ambient temperature 132, may represent the temperature of the air surrounding a system, but not the temperature of the air within a system in room 120 and not the temperature of the air directly from the exhaust output by a fan controlled by fan controller.

In the example, thermal control system 130 and fan controller 100 are independent systems, but when placed within room 120, the systems are interdependent and may run most efficiently when the inversely proportional relationship between the systems is optimized. For example, given the inversely proportional relationship of thermal control system 130 and fan controller 100, as thermal control system 130 uses more energy to cool the air and adjust ambient temperature 132 in room 120, fan controller 100 may reduce fan speeds to maintain component temperatures within a system. Because thermal control system 130 and fan controller 100 are not integrated as illustrated FIG. 1, given the inversely proportional relationship, thermal control system 130 may also inefficiently use power to aggressively cool room 120 while fans remain still. In addition, because thermal control system 130 and fan controller 100 are not integrated, given the inversely-proportional relationship, fan controller 100 may also inefficiently power spinning fans too quickly while the thermal control system 130 remains off because the thermal control system 130 has cooled room 120 to meet the ambient temperature set point, but the ambient temperature set point is higher than the maximum allowed temperature of a particular component.

Figure 2:
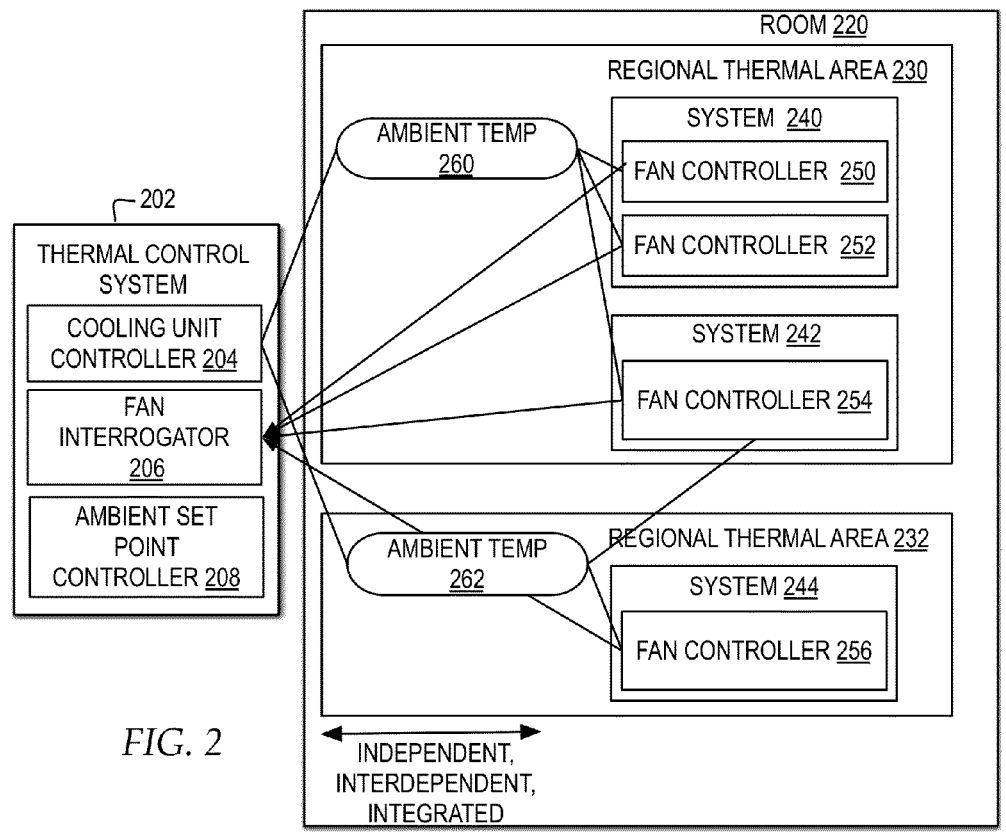
FIG. 2 is a block diagram illustrating one example of a thermal control system for monitoring and maintaining the temperature in a data center room and multiple fan controllers for controlling the fan speeds of multiple fans within one or more systems within the data center room, where the thermal control system and the fan controllers are independent systems that are integrated for optimizing the overall energy efficiency of the cooling infrastructure of the data center room.

Referring now to FIG. 2, a block diagram illustrates one example of a thermal control system for monitoring and maintaining the temperature in a data center room and multiple fan controllers for controlling the fan speeds of multiple fans within one or more systems within the data center room, where the thermal control system and the fan controllers are independent systems that are integrated for optimizing the overall energy efficiency of the cooling infrastructure of the data center room.

In the example, the cooling infrastructure of data center room 220 includes a thermal control system 202 and fan controllers 250, 252, 254, and 256. Each of thermal control system 202 and fan controllers 250, 252, 254, and 256 are illustrated as independent systems, but thermal control system 202 is integrated with fan controllers 250, 252, 254, and 256 to optimize the overall energy efficiency of the cooling infrastructure of the data center room 220. In the example, thermal control system 202 and fan controllers 250, 252, 254, and 256 are considered independent systems in that each system may operate as an independent functional unit separate from, and independent of, any other system, but interdependent in that thermal control system 202 and fan controllers 250, 252, 254, and 256 operate in an inversely proportional relationship. In the example, thermal control system 202 and fan controllers 250, 252, 254, and 256 are considered integrated in that fan controllers 250, 252, 254, and 256 report ambient temperature votes to thermal control system 202 and thermal control system 202 may adjust an ambient temperature set point for cooling room 220 based on the ambient temperature votes.

In the example, thermal control system 202 includes a cooling unit controller 204 for controlling one or more cooling units that manage air temperatures, airflow, and humidity room-wide within room 220. In one example, room 220 may include multiple regional thermal areas, such as regional thermal area 230 and regional thermal area 232, where cooling unit controller 204 may control one or more cooling units for directing cooling by regional thermal area.

In the example, room 220 includes multiple systems, illustrated as systems 240, 242, and 244. Systems 240, 242, and 244 each represent at least one component that dissipates heat and may represent multiple components, such as a rack of components, a row of multiple racks of components, a stack in a server, or other combinations of components. Components within systems may include, but are not limited to, processors, input/output devices, hubs, disk drives, memory, adapters, buses, and other hardware elements of a system.

In the example, systems 240, 242, and 244 may each include at least one fan, and at least one fan controller for controlling the fan speed to locally control air flow within a system, including pulling in cooler air output by thermal control system 202 into room 220 and blowing heated air out of the system through an exhaust vent or other opening. For example, system 240 includes a fan controller 250 and a fan controller 252, system 242 includes a fan controller 254, and system 244 includes a fan controller 256, where fan controllers 250 and 252 control fan speeds for locally controlling airflow within system 240, fan controller 254 controls fan speeds for locally controlling airflow within system 242, and fan controller 256 controls fan speeds for locally controlling airflow within system 256.

In the example, a fan interrogator 206 of thermal control system 202 is communicatively connected to receive inputs from each of fan controllers 250, 252, 254, and 256. In one example, each of fan controllers 250, 252, 254, and 256 is communicatively connected via wire line or via a network to send data to fan interrogator 206. In another example, one or more management controllers located locally within systems or on racks of systems may collect data from fan controllers 250, 252, 254, and 256 and transmit the collected data to fan interrogator 206.

In particular, each of fan controllers 250, 252, 254, and 256 are integrated with thermal control system 202 by reporting ambient temperature votes to fan interrogator 206. Fan interrogator 206 records the ambient temperature votes from the fan controllers 250, 252, 254, and 256. An ambient set point controller 208 of thermal control system 202 selects an ambient temperature set point for room 220 based on the ambient temperature votes received from the fan controllers, and may further select a separate ambient temperature set point for each of regional thermal area 230 and regional thermal area 232. Cooling unit controller 204 receives the ambient temperature set point from ambient set point controller 208, detects one or more ambient temperatures from one or more locations within room 220, such as ambient temperature 260 in regional thermal area 230 and ambient temperature 262 in regional thermal area 232, and adjusts the cooling by one or more cooling units to adjust the ambient temperatures in room 220 to meet the ambient temperature set point set by ambient set point controller 208.

For each of fan controllers 250, 252, 254, and 256 to specify an ambient temperature vote, each of fan controllers 250, 252, 254, and 256 receives multiple temperature inputs, including component temperatures proximate to one or more components and an ambient temperature. Each of fan controllers 250, 252, 254, and 256 compares the multiple temperature inputs with one or more set points for a component or system and votes for each of a fan speed for controlling a fan and an ambient temperature for sending to thermal control system 202. For example, each of fan controllers 250, 252, and 254 may receive an ambient temperature input of ambient temperature 260 indicating the air temperature in regional thermal area 230 and fan controller 256 may receive an ambient temperature input of ambient temperature 262 indicating the air temperature in regional thermal area 232. In one example, ambient temperature 260 is periodically measured by a system service processor (SSP), comprising hardware and firmware, for controlling a platform of system 240, and ambient temperature 260 is forwarded to fan controllers 250 and 252, which represent fan control logic in the SSP firmware. In another example, ambient temperature 262 is periodically measured by a second SSP for controlling a platform of system 244, and ambient temperature 262 is forwarded to fan controller 256, which represents fan control logic in the second SSP firmware.

By fan interrogator 206 collecting ambient temperature votes from each fan controller and ambient set point controller 208 selecting an ambient temperature set point based on the ambient temperature votes from the fan controllers, thermal control system 202 and fan controllers 250, 252, 254, and 256, ambient set point controller 208 selects an ambient temperature set point in coordination with fan settings by fan controllers 250, 252, 254, and 256 for optimizing use in view of the inversely-proportional relationship of thermal control system 202 and fan controllers 250, 252, 254, and 256. For example, in view of the inversely-proportional relationship of thermal control system 202 and fan controllers 250, 252, 254, and 256, an inefficient use of the systems may occur if thermal control system 202 is aggressively cooling, but all the fans are off or if all the fans are spinning rapidly, but thermal control system 202 is off. By ambient set point controller 208 setting an ambient temperature set point based on ambient temperature votes from fan controllers 250, 252, 254, and 256, although thermal control system 202 runs independently of fan controllers 250, 252, 254, and 256, thermal control system 202 will more efficiently run in relation to fan controllers 250, 252, 254, and 256. For example, ambient set point controller 208 may select the lowest ambient temperature voted for by fan controllers 250, 252, 254, and 256 as the ambient temperature set point, such that thermal control system 202 only works to cool the ambient temperature of room 220 to the lowest required temperature and such that the fan controller reporting the lowest ambient temperature may run fastest, but the fan controllers that can allow for higher temperatures, may run slower.

Figure 3:
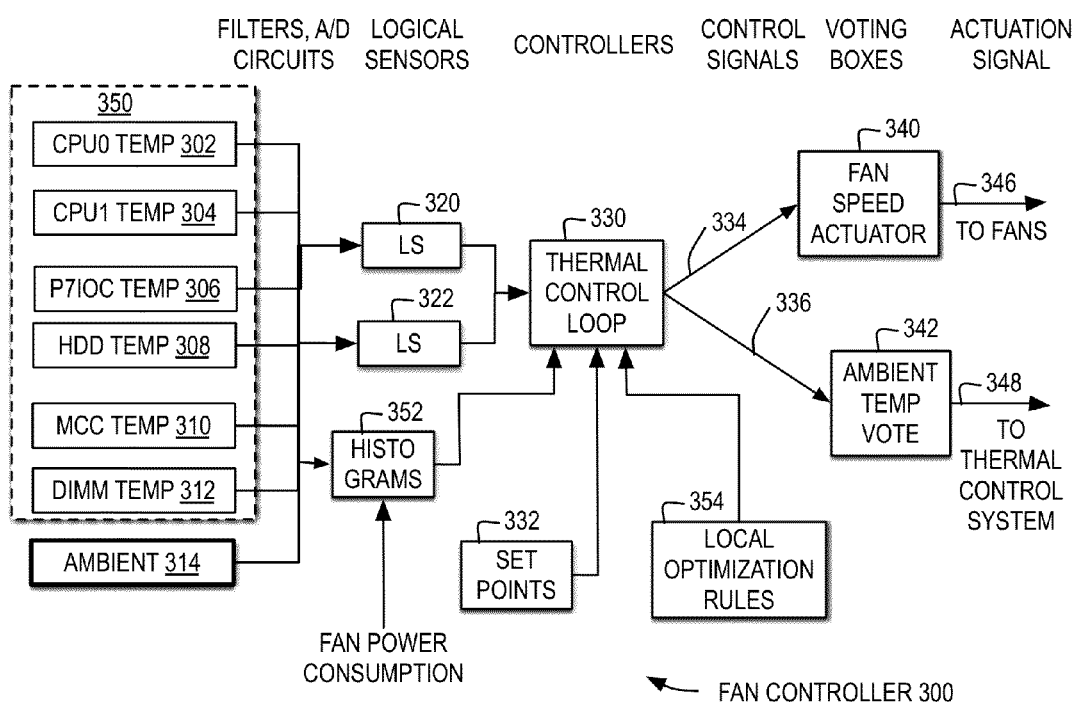
FIG. 3 is a block diagram illustrating one example of a fan controller for controlling a fan speed of a fan within a system within a data center room, where the fan controller determines the fan speed for local cooling within the system and sends an ambient temperature vote to a thermal control system that separately controls cooling of the data center room.

Referring now to FIG. 3, a block diagram illustrates one example of a fan controller for controlling a fan speed of a fan within a system within a data center room, where the fan controller determines the fan speed for local cooling within the system and sends an ambient temperature vote to a thermal control system that separately controls cooling of the data center room.

In the example, a fan controller 300 may access temperatures from one or more thermal sensors that include component temperatures 350 and an ambient temperature 314. Component temperatures 350 may include, for example, processor temperatures, such as CPU0 temp 302 and CPU1 temp 304, input/output (I/O) hub temperatures, such as IO Hub temp 306, disk drive temperatures, such as hard disk drive (HDD) temp 308, and memory temperatures, such as memory chip controller (MCC) temp 310 and dual in-line memory module (DIMM) temp 312. One of ordinary skill in the art will appreciate that additional or alternate component temperatures may be detected.

In the example, fan controller 300 may include one or more logical sensors, such as logical sensor 320 and logical sensor 322, that are firmware representations of the physical sensors being monitored from among the sensors monitoring component temperatures 350 and ambient temperature 314, through filters and circuits. In the example, logical sensors 320 and 322 filter the logical temperature measurements and pass logical temperature measurements to a thermal control loop 330. In another embodiment, additional or alternate logical sensors may be implemented.

Thermal control loop 330 receives set points 332, specifying one or more set points of required temperatures within a system, by component, or for a group of components. The required temperatures within a system may include minimum temperatures, maximum temperatures, and desired temperatures and may also specify a component with the highest maximum temperature within a system.

In the example, thermal control loop 330 compares the current temperatures provided by logical sensors 320 and 322 with set points 332 and calculates at least one fan speed and at least one ambient temperature vote. Thermal control loop 330 may implement one or more optimization rules, illustrated as local optimization rules 354, for calculating each fan speed and determining each ambient temperature vote to optimize power consumption for local component cooling. Examples of local optimization rules 354 for calculating fan speeds and ambient temperature votes for local optimization include, but are not limited to, use of lookup tables, modeling of and use of fan power consumption metrics, and modeling and use of on real fan power consumption metrics. In one example, fan controller 300 may record and analyze component temperatures 350 and ambient temperature 314 over time, may record and analyze fan power consumption over time, and may record and analyze additional temperature and power metrics accessible to fan controller 300 over time. Because thermal control loop 330 receives ambient temperature 314, thermal control loop 330 may optimize fan speeds not only based on current component temperatures and histograms 352, but also based on the ambient temperature within the room.

Thermal control loop 330 outputs each calculated fan speed as fan control signal 334 to a fan speed actuator 340 and outputs each ambient temperature vote as an ambient control signal 336 to an ambient temperature voting box 342. In one example, fan controller 300 may include additional control loops, such as a power control loop and a performance control loop, for calculating fan speeds to meet power and performance set points. The power control loop and performance control loops may also submit fan speeds to fan speed actuator 340 and ambient control signals to ambient temperature voting box 342. Fan speed actuator 340 and ambient temperature voting box 342 each select the minimum or maximum control signal from among multiple control signals received from multiple control loops. In one example, thermal control loop 330 outputs fan control signal 334 to fan speed actuator 340 of 2000 RPM, but a performance control loop outputs a fan control signal to fan speed actuator 340 of 4000 RPM, and fan speed actuator 340 automatically selects the maximum control signal input of 4000 RPM, such that the performance control loop "wins". Fan actuator 340 outputs a selected control signal for controlling a fan speed as fan actuation signal 346 and ambient temperature voting box 342 outputs a selected control signal for an ambient temperature vote as ambient temperature voting output 348.

Figure 4:
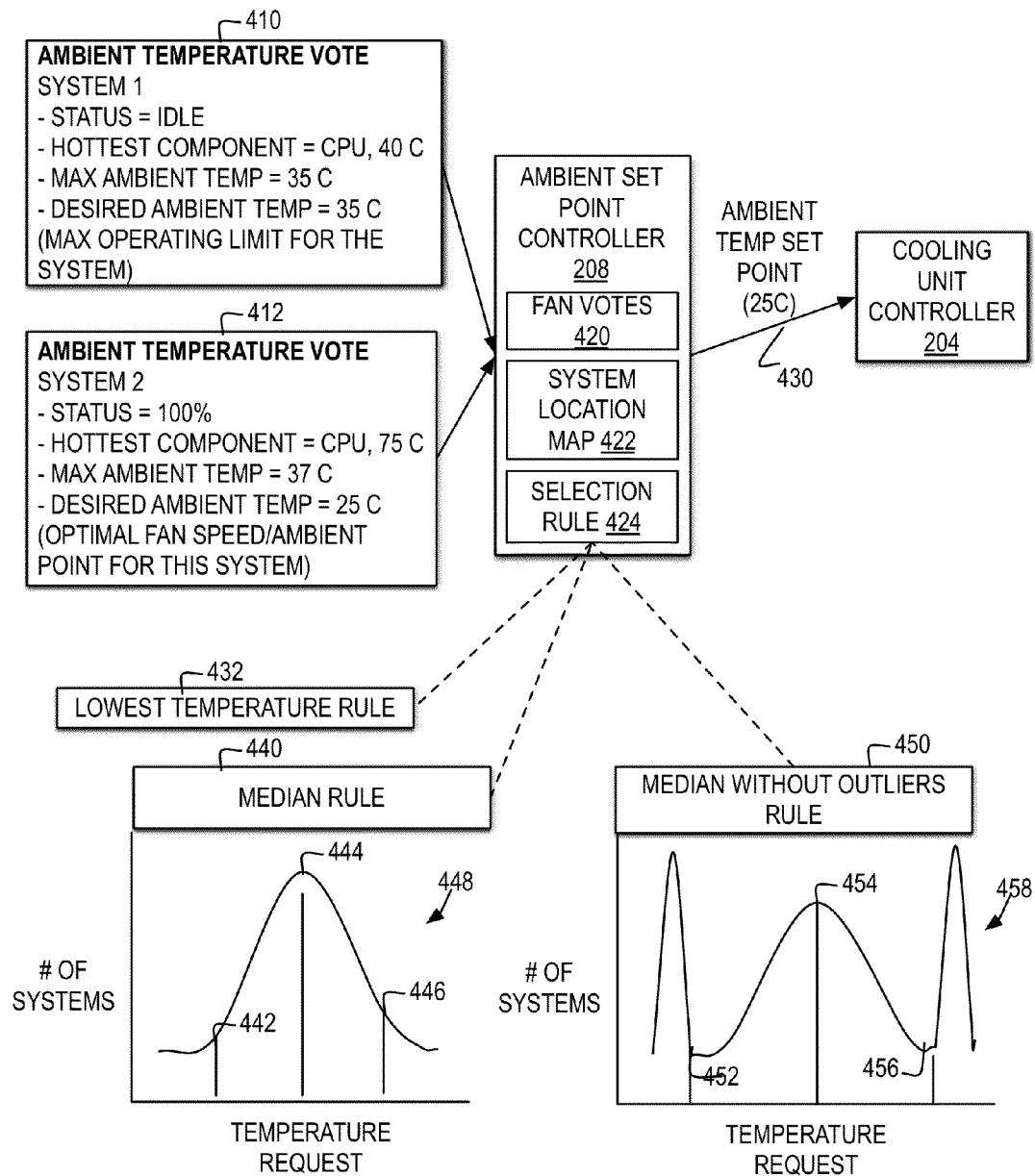
FIG. 4 is a block diagram illustrating one example of an ambient set point controller receiving multiple ambient temperature votes from multiple fan controllers and selecting an ambient temperature set point.

With reference now to FIG. 4, a block diagram illustrates one example of an ambient set point controller receiving multiple ambient temperature votes from multiple fan controllers and selecting an ambient temperature set point. In the example, ambient set point controller 208 receives an ambient temperature vote 410 from a "system1", such as system 240, and an ambient temperature vote 412 from a "system2", such as system 242. In the example, "system1" and "system2" each include at least one component in at least one system within a data center room. In addition, "system1" and "system2" each include at least one fan controller for controlling at least one fan within each system. Further, in the example, "system1" and "system2" are cooled by a same cooling unit, as directed by cooling unit controller 204, such as the cooling unit for regional thermal area 230.

In the example, ambient set point controller 208 stores ambient temperature votes 410 and 412 in fan votes 420 and periodically analyzes fan votes 420 to update an ambient temperature set point. In one example, ambient set point controller 208 may be set to automatically analyze fan votes 420 to update an ambient temperature set point at scheduled times. In addition, in one example, ambient set point controller 208 may be set to automatically analyze fan votes 420 and update ambient temperature set point based on events including, but not limited to, when an ambient temperature vote is received from a particular system, when a threshold number of temperature votes are received, when an ambient temperature vote is received and the maximum ambient temperature exceeds or is within a particular range of the current ambient temperature set point.

In updating an ambient temperature set point, ambient set point controller 208 may update ambient temperature set points by region for a particular room. In the example, ambient set point controller 208 accesses a system location map 422 to determine which regional thermal areas, such as regional thermal areas 230 and 232, are impacted by ambient temperature votes, based on the locations of systems submitting ambient temperature votes, and updates ambient temperature set points for regional thermal areas. In the example, ambient set point controller 208 sends an updated ambient temperature set point 430 for each regional thermal area to cooling unit controller 204, which may control multiple cooling units to cool a room to measurable air temperatures that meet ambient temperature set points 430.

In selecting an ambient temperature set point, ambient set point controller 208 may apply at least one selection rule 424 to calculate a lowest ambient temperature for ambient temperature set point 430. In the example selection rule 424 may include a lowest temperature rule 432 that selects the lowest desired ambient temperature within the multiple ambient temperature votes as the lowest ambient temperature for ambient temperature set point 430.

In another example, selection rule 424 may include a median rule 440 that calculates the mean or median value of the temperatures in the ambient temperature votes and selects the median temperature as the lowest ambient temperature for ambient temperature set point 430. For example, in distribution 448 illustrating a distribution of temperature requests in the ambient temperature votes, a median temperature 444 represents a median temperature at which half of the systems will be over-cooled and half of the systems will be under cooled, however, at deviation 442, most of the systems would be over-cooled and at deviation 446, most of the systems would be undercooled.

In another example, selection rule 424 may include a median without outlier rule 450 that eliminates outlier temperatures received in the ambient temperature votes and selects a mean or median value from the remaining temperature requests in the ambient temperature votes and selects the median temperature as the lowest ambient temperature for ambient temperature set point 430. For example, in distribution 458 illustrating a distribution of temperature requests in the ambient temperature votes, with outlier temperatures that are lower than temperature 452 and higher than temperature 456 removed, a median temperature 454 represents a median temperature that efficiently meets the ambient temperature needs of most of the systems without overcooling by cooling unit controller 204.

Ambient set point controller 208 receives ambient temperature votes including one or more ambient temperature values including, but not limited to, a desired ambient temperature, a minimum ambient temperature, and a maximum ambient temperature. In one example, ambient set point controller 208 may also receive ambient temperature votes that indicate the percentage of a system that is currently utilized and the maximum temperature of the component that has the hottest maximum temperature for the system.

In the example, ambient set point controller 208 receives ambient temperature vote 410 for "system1" that specifies a current system usage status of "idle", a hottest component of a "CPU" with a hottest temperature of "40 C", a maximum ambient temperature of "35 C", and a desired ambient temperature of "35 C". In the example, "system1" is idle and "system1" has selected to vote for a desired ambient temperature that is the maximum operating limit for the system. In the example, the maximum operating limit for the system is set to the maximum ambient temperature for the system, yielding the desired ambient temperature of "35 C". While in the example "system1" selected a desired ambient temperature equal to the maximum operating limit for the system when the system is set to an operating status of "idle", in other examples, a system may select other values for the desired ambient temperature when a system is idling.

In the example, ambient set point controller 208 receives ambient temperature vote 412 for "system2" that specifies a current system usage status of "100%", a hottest component of a "CPU" with a hottest temperature of "75 C", a maximum ambient temperature of "37 C", and a desired ambient temperature of "25 C". In the example, "system2" is operating at 100% system utilization and "system2" has selected to vote for a desired ambient temperature of 25 C, which represents the ambient set point at which the fan speed and ambient temperature set point are optimized for "system2", as determined by a fan controller for "system 2".

In the example, ambient set point controller 208 applies lowest temperature rule 432 of selection rule 424, which specifies that the lowest desired ambient temperature wins, and specifies an ambient temperature set point of 25 C for output to cooling unit controller 204. In other examples, ambient set point controller 208 may apply median rule 440 or median without outliers rule 450 of selection rule 424, to select ambient temperature set point 430.

Figure 5:
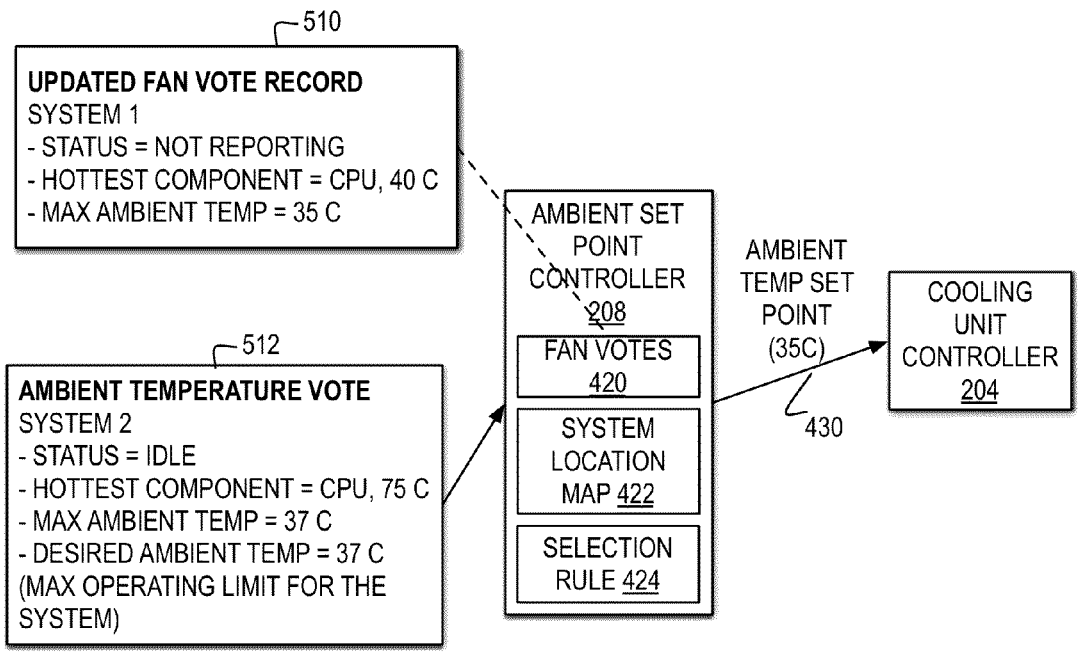
FIG. 5 is a block diagram illustrating one example of a an ambient set point controller receiving multiple ambient temperature votes from multiple fan controllers, including a controller for a system that is powering off, and selecting an ambient temperature set point.

With reference now to FIG. 5, a block diagram illustrates one example of a an ambient set point controller receiving multiple ambient temperature votes from multiple fan controllers, including a controller for a system that is powering off, and selecting an ambient temperature set point.

In the example, at a next reporting period, ambient set point controller 208 detects an updated ambient temperature vote 512 for "system2", following the previous ambient temperature vote 412 for "system2". Ambient set point controller 208 does not, however, detect an updated ambient temperature vote for "system1", following the previous ambient temperature vote 410 for "system1" because, for example, "system1" has powered down. In one example, a fan controller may send an ambient temperature vote to ambient set point controller 208 indicating that a system is powering down or ambient set point controller 208 may detect, based on the lack of reporting by a fan controller during a particular period, that a system has powered down.

In the example, when ambient set point controller 208 detects that a system is no longer reporting ambient temperature votes, ambient set point controller 208 may adjust the status for the system in a fan vote record previously stored for the system in fan votes 420 and maintain maximum ambient temperature records. In the example, ambient set point controller 208 detects that "system1" is no longer reporting an ambient temperature vote and updates a fan vote record 510 for "system1" to an operation status of "not reporting" and maintains record for the hottest component and maximum ambient temperature.

In addition, in the example, ambient set point controller 208 receives an updated ambient temperature vote 512 for "system2", following ambient temperature vote 412 for "system2". In the example, updated ambient temperature vote 512 includes a status of "idle" and an updated desired ambient temperature of "37 C", which represents the maximum operating limit for the system, set to the maximum ambient temperature of "37 C". In the example, when "system2" transitions from an operational status of 100% to an operational status of idle, "system2" votes for a higher ambient temperature of "37 C", as illustrated in ambient temperature vote 512, compared with the desired ambient temperature of "25 C" in ambient temperature vote 412. By voting for a higher ambient temperature when "system2" becomes idle, "system2" votes to reduce the amount of cooling necessary.

In the example, even though "system1" is powered down and "system2" is idle, selection rule 424 still applies a lowest temperature wins rule "system1" and "system2", setting the lowest temperature voted for by "system1" as the maximum ambient temperature when "system1" is not reporting a vote, as illustrated in updated fan vote record 510. In the example, ambient set point controller 208 compares the maximum ambient temperature of "35 C" for "system1" with the desired ambient temperature for "system2" of "37 C" and sets ambient temperature set point 430 to "35 C", the lower of the compared temperatures.

In particular, in the example, because an ambient temperature generally requires more time than changing a fan speed, selection rule 424 is specified so that if a system is powered off, thermal control system 202 will still maintain the ambient temperature set point within the room to ensure that when the system is powered on again, the system will not power on and attempt to boot up in thermal conditions outside the thermal ratings for the system. In another example, selection rule 424 may be further specified so that if all systems in a room are powered off, thermal control system 202 will maintain the ambient temperature set point in the room to ensure that the ambient temperature does not exceed any hottest component temperature setting for any system.

Figure 6:
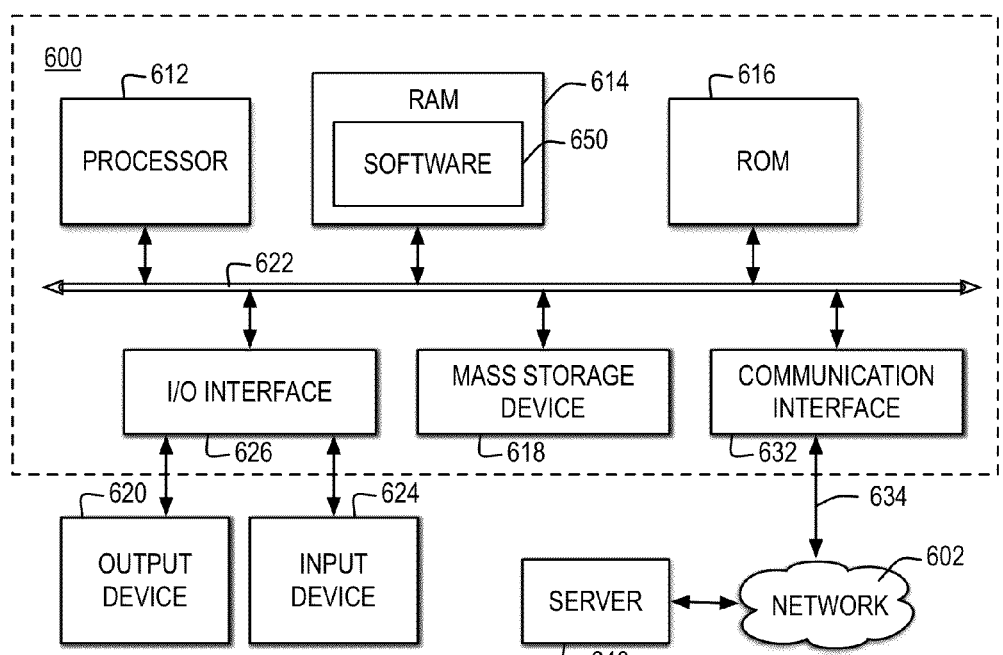
FIG. 6 is a block diagram illustrating one example of a schematic of a computer system in which the present invention may be implemented.

FIG. 6 illustrates one example of a schematic of a computer system in which the present invention may be implemented. The present invention may be performed in a variety of systems and combinations of systems, made up of functional components, such as the functional components described with reference to computer system 600 and may be communicatively connected to a network, such as network 602. In one example, thermal control system 202, system 240, fan controller 250, fan controller 252, system 242, fan controller 254, system 244, and fan controller 256, for example, may each implement one or more instances of functional components of computer system 600. In another example, computer system 600 may represent one or more cloud computing nodes.

Computer system 600 includes a bus 622 or other communication device for communicating information within computer system 600, and at least one hardware processing device, such as processor 612, coupled to bus 622 for processing information. Bus 622 preferably includes low-latency and higher latency paths that are connected by bridges and adapters and controlled within computer system 600 by multiple bus controllers. When implemented as a server or node, computer system 600 may include multiple processors designed to improve network-servicing power. Where multiple processors share bus 622, additional controllers (not depicted) for managing bus access and locks may be implemented.

Processor 612 may be at least one general-purpose processor such as IBM® PowerPC® (IBM and PowerPC are registered trademarks of International Business Machines Corporation) processor that, during normal operation, processes data under the control of software 650, which may include at least one of application software, an operating system, middleware, and other code and computer executable programs accessible from a dynamic storage device such as random access memory (RAM) 614, a static storage device such as Read Only Memory (ROM) 616, a data storage device, such as mass storage device 618, or other data storage medium. Software 650, including operating system and application software, may include, but is not limited to, code, applications, protocols, interfaces, and processes for controlling one or more systems.

Figure 7:
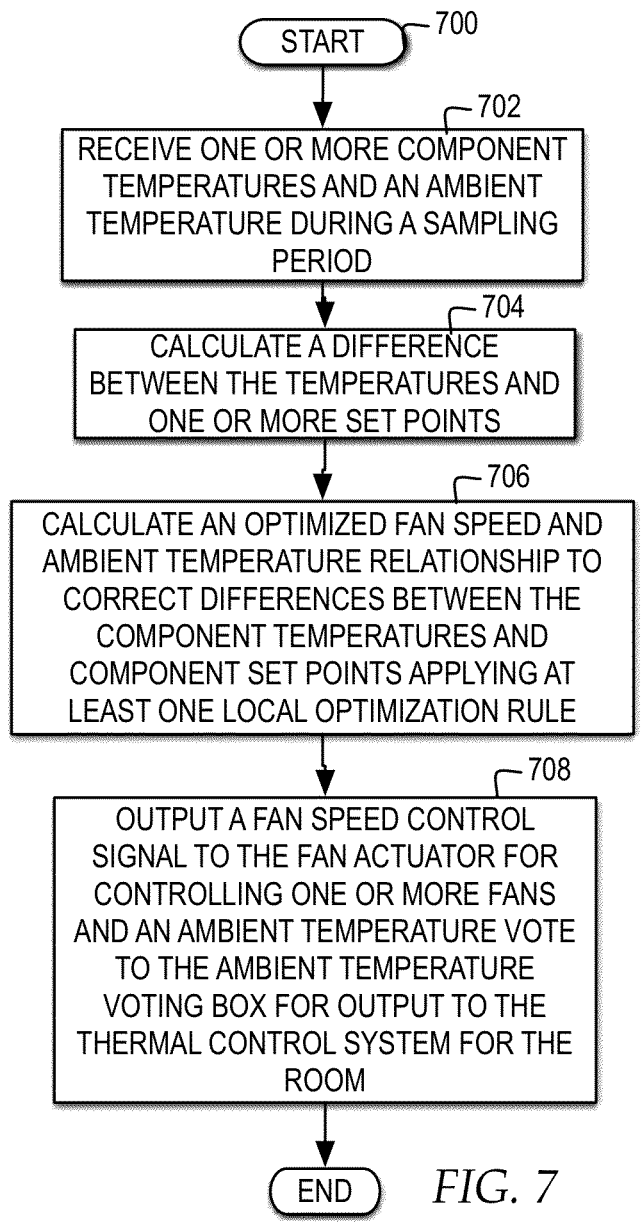
FIG. 7 is a high level logic flowchart illustrating a process and program for managing a thermal control loop controller of a fan controller independent of, but integrated with a thermal control system.
Figure 8:
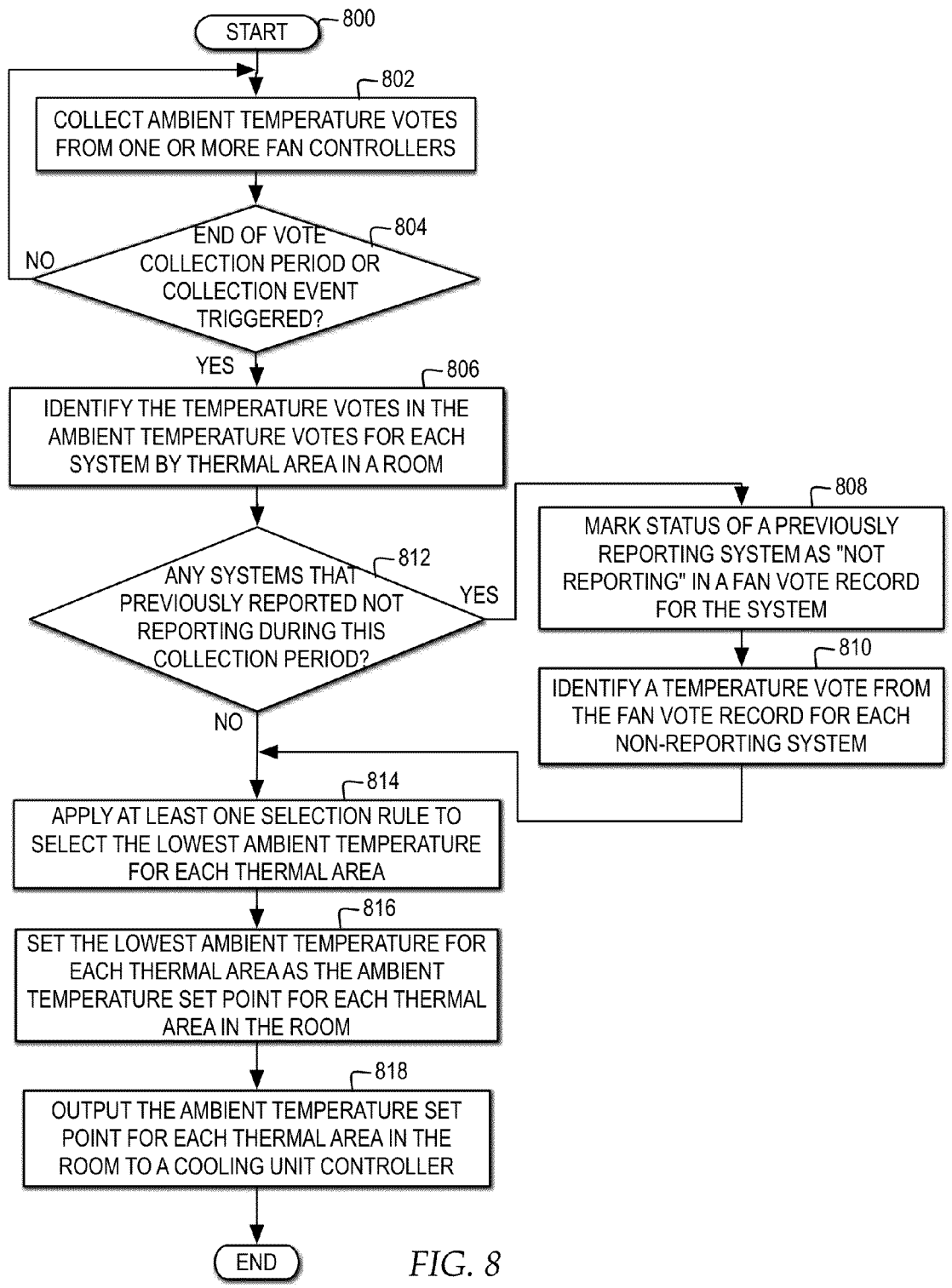
FIG. 8 is a high level logic flowchart illustrating a process and program for setting an ambient temperature set point in a thermal control system based on ambient temperature votes from independent fan controllers.

In one embodiment, the operations performed by processor 612 may control the operations of flowchart of FIGS. 7 and 8 and other operations described herein. Operations performed by processor 612 may be requested by software, such as operating system and application software, or other code or the steps of one embodiment of the invention might be performed by specific hardware components that contain hardwired logic for performing the steps, or by any combination of programmed computer components and custom hardware components.

Those of ordinary skill in the art will appreciate that aspects of one embodiment of the invention may be embodied as a system, method or computer program product. Accordingly, aspects of one embodiment of the invention may take the form of an entirely hardware embodiment, an entirely software embodiment (including firmware, resident software, microcode, etc.) or an embodiment containing software and hardware aspects that may all generally be referred to herein as "circuit," "module," or "system." Furthermore, aspects of one embodiment of the invention may take the form of a computer program product embodied in one or more tangible computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, such as mass storage device 618, a random access memory (RAM), such as RAM 614, a read-only memory (ROM) 616, an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction executing system, apparatus, or device.

A computer readable signal medium may include a propagated data signal with the computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction executable system, apparatus, or device.

Program code embodied on a computer readable medium may be transmitted using any appropriate medium, including but not limited to, wireless, wire line, optical fiber cable, radio frequency (RF), etc., or any suitable combination of the foregoing.

Computer program code for carrying out operations of on embodiment of the invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, such as computer system 600, partly on the user's computer, as a stand-alone software package, partly on the user's computer and partly on a remote computer or entirely on the remote computer or server, such as server 640. In the latter scenario, the remote computer may be connected to the user's computer through any type of network, such as network 602, through a communication interface, such as network interface 632, over a network link that may be connected, for example, to network 602.

In the example, network interface 632 includes an adapter 634 for connecting computer system 600 to network 602 through a link. Although not depicted, network interface 632 may include additional software, such as device drivers, additional hardware and other controllers that enable communication. When implemented as a server, computer system 600 may include multiple communication interfaces accessible via multiple peripheral component interconnect (PCI) bus bridges connected to an input/output controller, for example. In this manner, computer system 900 allows connections to multiple clients or servers via multiple separate ports and each port may also support multiple connections to multiple clients or multiple servers.

One embodiment of the invention is described herein with reference to flowchart illustrations and/or block diagrams of methods, apparatus (systems) and computer program products according to embodiments of the invention. Those of ordinary skill in the art will appreciate that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, such as computer system 600, or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer, such as computer system 600, or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Network interface 632, the network link to network 602, and network 602 may use electrical, electromagnetic, or optical signals that carry digital data streams. The signals through the various networks and the signals on network 602, the network link to network 602, and network interface 632 which carry the digital data to and from computer system 600, may be forms of carrier waves transporting the information.

In addition, computer system 600 may include multiple peripheral components that facilitate input and output. These peripheral components are connected to multiple controllers, adapters, and expansion slots, such as input/output (I/O) interface 626, coupled to one of the multiple levels of bus 622. For example, input device 624 may include, for example, a microphone, a video capture device, an image scanning system, a keyboard, a mouse, or other input peripheral device, communicatively enabled on bus 622 via I/O interface 626 controlling inputs. In addition, for example, output device 620 communicatively enabled on bus 622 via I/O interface 626 for controlling outputs may include, for example, one or more graphical display devices, audio speakers, and tactile detectable output interfaces, but may also include other output interfaces. In alternate embodiments of the present invention, additional or alternate input and output peripheral components may be added.

Those of ordinary skill in the art will appreciate that the hardware depicted in FIG. 6 may vary. Furthermore, those of ordinary skill in the art will appreciate that the depicted example is not meant to imply architectural limitations with respect to the present invention.

With reference now to FIG. 7, a high-level logic flowchart illustrates a process and program for managing a thermal control loop controller of a fan controller independent of, but integrated with a thermal control system. In the example, the process starts at block 700 and thereafter proceeds to block 702. Block 702 illustrates the thermal control loop controller receiving one or more component temperatures and an ambient temperature during a sampling period. Next, block 704 depicts calculating a difference between the temperatures and one or more set points. Thereafter, block 706 illustrates calculating an optimized fan speed and ambient temperature relationship to correct differences between the component temperatures and the component set points by applying at least one local optimization rule. Next, block 708 depicts outputting a fan speed control signal to the fan actuator for controlling one or more fans and outputting an ambient temperature vote to the ambient temperature voting box for output to the thermal control system for the room in which the fan controller is placed, and the process ends.

Referring now to FIG. 8, a high-level logic flowchart illustrates a process and program for setting an ambient temperature set point in a thermal control system based on ambient temperature votes from independent fan controllers. In the example, the process starts at block 800 and thereafter proceeds to block 802. Block 802 illustrates collecting ambient temperature votes from one or more fan controllers during a collection period. Next, block 804 depicts a determination whether the current collection period has ended or another collection event has been triggered. In one example, a collection event may be triggered if a system that was previously powered off and not reporting ambient temperature votes, reports an ambient temperature vote. If the current collection period has ended, then the process passes to block 806. Block 806 illustrates identifying the temperature votes in the ambient temperature votes for each system for each thermal area in the room, and the process passes to block 812.

Block 812 depicts a determination whether any systems, which previously reported an ambient temperature vote, are not reporting an ambient temperature vote during this collection period. At block 812, if any systems that previously reported are not reporting during this collection period, then the process passes to block 808. Block 808 depicts marking the status of a previously reporting system as "not reporting" in a fan vote record of a previous ambient temperature vote. Next, block 810 illustrates identifying a temperature vote from the fan vote record for non-reporting system, and the process passes to block 814. Returning to block 812, if all systems are reporting during the reporting period, then the process passes to block 814.

Block 814 illustrates applying at least one selection rule to select the lowest ambient temperature from among the current temperature votes for each thermal area. Next, block 816 depicts setting the lowest ambient temperature for each thermal area as the ambient temperature set point for each thermal area in the room. Thereafter, block 818 illustrates outputting the ambient temperature set point for each thermal area in the room to a cooling unit controller, and the process ends.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, occur substantially concurrently, or the blocks may sometimes occur in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification specify the presence of stated features, integers, steps, operations, elements, and/or components, but not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the one or more embodiments of the invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been particularly shown and described with reference to one or more embodiments, it will be understood by those skilled in the art that various changes in form and detail may be made therein without departing from the spirit and scope of the invention.

What is claimed is:

1. A system for managing a thermal environment in a data center room, comprising:
    a data center room comprising a plurality of computer systems each housing at least one fan from among a plurality of fans each positioned in the plurality of computer systems for controlling a separate local temperature by controlling local airflow within each separate computer system from among the plurality of systems, wherein each fan is controlled by at least one fan controller from among a plurality of fan controllers positioned within the plurality of computer systems, wherein each of the plurality of computer systems comprises a separate at least one component that generates heat;
    each separate fan controller comprising a closed-loop fan controller system with a single input and a single output for controlling at least one fan of the plurality of fans, each fan controller system specified with a separate thermal set point comprising a maximum temperature for at least one of a plurality of components of each of the plurality of systems;
    each separate fan controller from among the plurality of fan controllers operative to receive the single input comprising at least one separate component temperature of at least one temperature measured by a component sensor proximate to the separate at least one component and an local ambient temperature measured by a temperature sensor proximate to air surrounding the at least one separate component and not proximate to exhaust air pushed out by the at least one fan;
    each separate fan controller operative to apply at least one local optimization rule to calculate, based on the single input and the thermal set point, a desired ambient temperature and a fan speed relationship to correct differences between the single input and the thermal set point and optimize power usage for cooling of the separate at least one component by the separate fan controller in relation to a separate cooling of an ambient temperature in the data center room by one or more cooling units, wherein the fan speed relationship specifies the single output comprising a control signal for specifying whether to turn the at least one fan of the plurality of fans on and a speed for the at least one fan if turned on;

each separate fan controller operative to output a control signal for the calculated fan speed to control a separate fan from among the plurality of fans;

each separate fan controller operative to output the desired ambient temperature in a separate ambient temperature vote from among the plurality of ambient temperature votes;

a thermal control system for controlling the ambient temperature in the data center room to meet an ambient temperature set point through a cooling unit controller that directs the one or more cooling units that control cooling of the ambient temperature within the data center room to meet the ambient temperature set point, wherein the cooling unit controller only directs the one or more cooling units, wherein the cooling unit controller and the one or more cooling units operate independently of the plurality of fan controllers and the plurality of fans, wherein the thermal control system does not direct the plurality of fan controllers;

the thermal control system operative to receive each separate ambient temperature from among the plurality of ambient temperature votes from the plurality of fan controllers, each separate ambient temperature vote comprising an identifier for a particular system from among the plurality of systems, a desired ambient temperature, and at least one maximum temperature from among a maximum ambient temperature and a maximum component temperature;

the thermal control system, operative to set the ambient temperature set point to a lowest ambient temperature specified in the plurality of ambient temperature votes, by calculating the lowest ambient temperature specified in the plurality of ambient temperature votes by removing at least one outlier temperature from among the plurality of ambient temperature votes and calculating a median temperature of the remaining ambient temperature votes from among the plurality of ambient temperature votes, wherein the lowest ambient temperature is set to the median temperature;

the thermal control system, operative to output the ambient temperature set point for each thermal area to the cooling unit controller;

the thermal control system operative to collect the plurality of ambient temperature votes during a first collection period, wherein the plurality of fan controllers report the plurality of ambient temperature votes during the first collection period;

the thermal control system operative to store a fan vote record of the plurality of ambient temperature votes;

the thermal control system operative to collect a second plurality of ambient temperature votes during a second collection period, wherein the second plurality of ambient temperature votes is less than the plurality of ambient temperature votes;

the thermal control system, responsive to reaching the end of the second collection period, operative to determine at least one particular fan controller from among the plurality of fan controllers previously reporting during the first collection period are not reporting during the second collection period;

the thermal control system, responsive to detecting the at least one particular fan controller not reporting during the second collection period, operative to mark a status of the at least one particular fan controller as not reporting in the fan vote record to indicate the at least one particular system is not reporting during the second collection period and identify at least one desired ambient temperature vote for the at least one particular system from at least one previously recorded desired ambient temperature vote stored in the fan vote record in association with the at least one particular fan controller; and the thermal control system, responsive to detecting all of the plurality of fan controllers not reporting during the second reporting period, for maintaining the ambient temperature set point at a temperature that does not exceed any hottest component temperature setting of any of the plurality of components of the plurality of systems.

2. The system according to claim 1, further comprising:
the thermal control system comprising a fan interrogator operative to receive communications of the plurality of ambient temperature votes from each of the plurality of fan controllers.

3. The system according to claim 1, further comprising:
the thermal control system operative to identify a separate thermal area from among a plurality of thermal areas associated with each of the plurality of ambient temperature votes;
the thermal control system operative to identify a separate area lowest ambient temperature specified in the plurality of ambient temperature votes for each thermal area; and
the thermal control system operative to set a separate area ambient temperature set point to each separate area lowest ambient temperature for each thermal area.

4. A computer program product for managing a thermal environment in a data center room, said computer program product tangibly embodied in a non-transitory computer-readable storage medium and comprising computer executable instructions which cause a computer to:

receive, by a thermal control system for a data center room comprising a plurality of computer systems for controlling an ambient temperature in the data center room to meet an ambient temperature set point, a plurality of ambient temperature votes from a plurality of fan controllers positioned in the data center room, the plurality of computer systems each housing at least one fan from among plurality of fans each positioned in the plurality of computer systems for controlling a separate local temperature by controlling local airflow within each separate computer system from among the plurality of computer systems, wherein each of the plurality of computer systems comprises a separate at least one component that generates heat, each separate fan controller comprising a closed-loop fan controller system with a single input and a single output for controlling at least one fan of the plurality of fans, each fan controller system specified with a separate thermal set point comprising a maximum temperature for at least one of a plurality of components of each of the plurality of systems, each separate fan controller from among the plurality of fan controllers operative to receive the single input comprising at least one separate component temperature of at least one temperature measured by a component sensor proximate to the separate at least one component and an local ambient temperature measured by a temperature sensor proximate to air surrounding the at least one separate component and not proximate to exhaust air pushed out by the at least one fan, each separate fan controller operative to apply at least one local optimization rule to calculate, based on the single input and the thermal set point, a desired ambient temperature and a fan speed relationship to correct differences between the single input and the thermal set point and optimize power usage for cooling of the separate at least one component by the separate fan controller in relation to a separate cooling of the ambient temperature in the data center room by one or more cooling units, wherein the fan speed relationship specifies the single output comprising a control signal for specifying whether to turn the at least one fan of the plurality of fans on and a speed for the at least one fan if turned on, each separate fan controller operative to output a control signal for the calculated fan speed to control a separate fan from among the plurality of fans, each separate fan controller operative to output the desired ambient temperature in the separate ambient temperature vote from among the plurality of ambient temperature votes, each separate ambient temperature vote comprising an identifier for a particular system from among the plurality of systems, a desired ambient temperature, and at least one maximum temperature from among a maximum ambient temperature and a maximum component temperature;

set, by the thermal control system, the ambient temperature set point to a lowest ambient temperature specified in the plurality of ambient temperature votes, by calculating the lowest ambient temperature specified in the plurality of ambient temperature votes by removing at least one outlier temperature from among the plurality of ambient temperature votes and calculating a median temperature of the remaining ambient temperature votes from among the plurality of ambient temperature votes, wherein the lowest ambient temperature is set to the median temperature;

output, by the thermal control system, the ambient temperature set point for each thermal area to a cooling unit controller, the cooling unit controller for controlling the ambient temperature in the data center room to meet the ambient temperature set point by directing the one or more cooling units that control cooling of the ambient temperature within the data center room to meet the ambient temperature set point, wherein the cooling unit controller only directs the one or more cooling units, wherein the cooling unit controller and one or more cooling units operate independently of the plurality of fan controllers and the plurality of fans, wherein the thermal control system does not direct the plurality of fan controllers;

collect, by the thermal control system, the plurality of ambient temperature votes during a first collection period, wherein the plurality of fan controllers report the plurality of ambient temperature votes during the first collection period;

store, by the thermal control system, a fan vote record of the plurality of ambient temperature votes;

collect, by the thermal control system, a second plurality of ambient temperature votes during a second collection period, wherein the second plurality of ambient temperature votes is less than the plurality of ambient temperature votes;

responsive to reaching the end of the second collection period, determine, by the thermal control system, at least one particular fan controller from among the plurality of fan controllers previously reporting during the first collection period are not reporting during collection period;

responsive to detecting the at least one particular fan controller not reporting during the second collection period, mark, by the thermal control system, a status of the at least one particular fan controller as not reporting in the fan vote record to indicate the at least one particular system is not reporting during the second collection period and identify at least one desired ambient temperature vote for the at least one particular system from at least one previously recorded desired ambient temperature vote stored in the fan vote record in association with the at least one particular fan controller; and responsive to detecting all of the plurality of fan controllers not reporting during the second reporting period, maintain, by the thermal control system, the ambient temperature set point at a temperature that does not exceed any hottest component temperature setting of any of the plurality of components of the plurality of systems.

5. The computer program product according to claim 4, further comprising computer executable instructions which cause a computer to:

receive, by the thermal control system, the plurality of ambient temperature votes, wherein the thermal control system comprises a computer room air conditioning unit further comprising a fan interrogator for receiving communications of the plurality of ambient temperature votes from each of the plurality of fan controllers.

* * * * *